US009000764B2

(12) United States Patent
Karnaushenko et al.

(10) Patent No.: US 9,000,764 B2
(45) Date of Patent: Apr. 7, 2015

(54) METHOD FOR THE PRODUCTION OF PRINTED MAGNETIC FUNCTIONAL ELEMENTS FOR RESISTIVE SENSORS AND PRINTED MAGNETIC FUNCTIONAL ELEMENTS

(75) Inventors: Daniil Karnaushenko, Dresden (DE); Denys Makarov, Dresden (DE); Oliver G. Schmidt, Dresden (DE)

(73) Assignee: Leibniz-Institut fuer Festkoerper und Werkstoffforschung Dresden e.V., Dresden (DE)

(*) Notice: Subject to any disclaimer, the term of this patent is extended or adjusted under 35 U.S.C. 154(b) by 182 days.

(21) Appl. No.: 13/528,076

(22) Filed: Jun. 20, 2012

(65) Prior Publication Data

US 2012/0326714 A1 Dec. 27, 2012

(30) Foreign Application Priority Data

Jun. 21, 2011 (DE) ........................ 10 2011 077 907

(51) Int. Cl.
*G01R 33/09* (2006.01)
*H01F 41/18* (2006.01)
(Continued)

(52) U.S. Cl.
CPC ................ *H01F 41/18* (2013.01); *H01F 41/14* (2013.01); *H01F 41/20* (2013.01)

(58) Field of Classification Search
CPC ................................ G01R 33/09; H01L 3/00
USPC ................ 324/252, 207, 200, 219, 260, 262; 257/444, 414, 423; 438/48, 3; 29/603.13, 603.15, 607, 417, 842, 884, 29/603.07; 428/827, 832, 836.1
See application file for complete search history.

(56) References Cited

U.S. PATENT DOCUMENTS 6,225,392 B1 * 5/2001 Sunahara ..................... 524/404
6,305,174 B1 10/2001 Binneberg et al.
(Continued)

FOREIGN PATENT DOCUMENTS

DE 602 04 650 T2 3/2005
WO WO 00/24946 5/2000
WO WO 2011/029629 A2 3/2011

OTHER PUBLICATIONS

S.S.P. Parkin, "Flexible giant magnetoresistance sensors", Applied Physics Letters, 69, 3092-3094 (1996).
(Continued)

*Primary Examiner* — Arleen M Vazquez
*Assistant Examiner* — Neel Shah
(74) *Attorney, Agent, or Firm* — Greenblum & Bernstein, P.L.C.

(57) ABSTRACT

A method for producing printed magnetic functional elements for resistance sensors and printed magnetic functional elements. The invention refers to the field of electronics and relates to a method for producing resistance sensors, such as can be used, for example, in magnetic data storage for read sensors or in the automobile industry. The disclosure includes a simple and cost-effective production method and to obtain such printed magnetic functional elements with properties that can be adjusted as desire, in which a magnetic material is deposited onto a substrate as a film, is removed from the substrate and divided into several components and these components are applied on a substrate by means of printing technologies. Aspects are also directed to a printed magnetic functional element for resistance sensors of several components of a film, wherein at least 5% of the components of the functional element have a magnetoimpedance effect.

11 Claims, 4 Drawing Sheets

(51) Int. Cl.
*H01F 41/14* (2006.01)
*H01F 41/20* (2006.01)

(56) References Cited

U.S. PATENT DOCUMENTS

| | | | | |
|---|---|---|---|---|
| 6,398,999 | B1 | 6/2002 | Josephy et al. | |
| 6,881,239 | B2 | 4/2005 | Uchida | |
| 7,094,665 | B2 | 8/2006 | Shimoda et al. | |
| 7,198,736 | B2 | 4/2007 | Kasuga et al. | |
| 7,202,544 | B2 * | 4/2007 | Gruen et al. | 257/444 |
| 7,285,476 | B2 * | 10/2007 | Shimoda et al. | 438/455 |
| 7,608,348 | B2 * | 10/2009 | Faehler | 428/836.1 |
| 7,878,056 | B2 * | 2/2011 | Huang et al. | 73/204.26 |
| 2003/0008068 | A1 | 1/2003 | Josephy et al. | |
| 2003/0145680 | A1 | 8/2003 | Uchida | |
| 2008/0237548 | A1 * | 10/2008 | Uchida | 252/513 |
| 2008/0260941 | A1 * | 10/2008 | Jin | 427/126.4 |
| 2012/0168222 | A1 * | 7/2012 | Bartos et al. | 174/391 |

OTHER PUBLICATIONS

Y. Yang et al., "Thermal Characterization of Cu/CoFe Multilayer for Giant Magnetoresistive Head Applications", Journal of Heat Transfer, 128,113-120 (2006).

S. Ram et al., "Granular GMR Sensors of Co—Cu and Co—Ag Nanoparticles Synthesized through a Chemical Route Using $NaBH_4$", Phys. stat. sol., 188, vol. 3, 1129-1140 (2001).

* cited by examiner

METHOD FOR THE PRODUCTION OF PRINTED MAGNETIC FUNCTIONAL ELEMENTS FOR RESISTIVE SENSORS AND PRINTED MAGNETIC FUNCTIONAL ELEMENTS

CROSS-REFERENCE TO RELATED APPLICATIONS

The present application claims priority under 35 U.S.C. §119 (a) of German Patent Application No. 10 2011 077 907.8, filed Jun. 21, 2011, the disclosure of which is expressly incorporated by reference herein in its entirety.

The invention refers to the field of electronics and relates to a method for producing printed magnetic functional elements for resistance sensors, such as can be used, for example, in magnetic data storage for read sensors or in the automobile industry, as active magnetic elements in biosensors or in organic electronic components, and printed magnetic functional elements of this type.

The magnetoimpedance effect describes the change of the complex resistance of a magnetic material with the application of a magnetic field. The magnetoimpedance effect thereby comprises all the magnetoresistance effects, such as the anisotropic magnetoresistance (AMR) effect, the giant magnetoresistance effect (GMR) and the giant magnetothermal resistance effect.

Magnetic sensor elements are typically produced by the application of metal films in individual or multiple layers onto planar rigid surfaces, which determine the shape of the element. Efforts have been made to produce elastic magnetic sensors on flexible and bendable substrates (Parkin, S.S.P., Appl. Phys. Lett. 69 (1996), 3092). These elastic sensors are very light and they can be reshaped after their production. They therefore are becoming increasingly attractive for applications. One possibility for the production of such cost-effective magnetic functional elements for resistance sensors is printing, as is typical in the electronic industry. Printing technologies of this type are based on the use of conductive composite materials, such as silver pastes (U.S. Pat. No. 6,225,392), organic semiconductors or inorganic powders, which are usually processed in solutions, whereby they can be applied onto surfaces by means of printing technologies. The main advantage of printing technologies lies in the production of reliable and light electronic components at low cost and on a plurality of flexible substrates (U.S. Pat. No. 6,305,174).

Magnetic functional elements for resistance sensors can operate with direct current or alternating current. The power dissipation can be controlled by the application of an external magnetic field. The thermal conductivity of such elements thus changes with the applied external magnetic field, such as with the so-called giant magnetothermal resistance effect (Yang, Y, Journal of Heat Transfer 128 (2006) 113-120). A functional element of this type can be used as a thermomagnetic active element in medicine and biology or in heat transport systems, e.g., in cooling systems as a non-mechanical heat flow sensor.

A powder of magnetic particles with magnetic impedance can be produced by firstly depositing thin layers of the material. Thin layers of this type can be produced by a plurality of coating technologies, such as magnetron sputtering, electron beam coating, chemical vapor deposition (CVD) or molecular beam coating without substrates (Ram, S., Phys. Stat. Sol. (a) 188 (2001) 1129-1140) or with substrates and separation layers (WO 0024946; U.S. Pat. No. 7,094,665). Moreover, the powders can be produced by means of various known methods, for instance by chemical syntheses or mechanical methods.

The production of solutions with particles with a magnetoresistant effect can be carried out in a similar manner to the production of solutions with silver particles, resins, hardening agents and a solvent (U.S. Pat. No. 7,198,736). These solutions are applied to a substrate, dried and the epoxy resin is cured. This method has a very good reproducibility.

The object of the invention is to develop a simple and cost-effective production method for printed magnetic functional elements and to obtain such printed magnetic functional elements with properties that can be adjusted as desired.

The object is attained by the invention disclosed in the claims. Advantageous embodiments are the subject matter of the subordinate claims.

In the method according to the invention for producing a magnetic functional element for resistance sensors, in which at least 5% by weight of a magnetic material that has a magnetoimpedance effect or of magnetic materials which in their combination have a magnetoimpedance effect, is deposited on a substrate as a film by means of thin film technologies, the film is removed from the substrate and during the removal or subsequently, the film is divided into several components, thereafter these components are processed with a liquid to form a dispersion or a paste or a gel and subsequently are applied on a substrate by means of printing technologies and thereafter the liquid is removed and further processing steps follow, wherein the components of the film and/or other electrically conducting materials are applied as a functional element in such quantity that the conductivity of the functional element is realized.

Advantageously, a material that has a GMR effect and/or an AMR effect is used as a magnetic material.

Likewise advantageously, Co/Cu, Py/Cu, Fe/Cr or Co/Au are used as a magnetic material.

Furthermore advantageously, magnetron sputtering, electron beam coating, chemical vapor deposition (CVD) or molecular beam coating are used as thin film technologies.

And also advantageously, coated or uncoated materials, paper or paper-like materials, wood or wood-like materials, inorganic materials such as glass, silicon wafers, metals, alloys, ceramic, organic materials, such as polymers, plastics, rubber, textiles or crystalline, polycrystalline or amorphous materials are used as substrates both for the thin film technologies as well as for the printing technologies.

It is also advantageous if the removal of the film from the substrate is realized in a physical, chemical, thermal or electrical manner, or by using acoustic surface waves.

It is likewise advantageous if the separation of the film into components is carried out by tearing, breaking, cutting, milling.

Furthermore, it is advantageous if water, organic or inorganic solvents are used as a liquid.

And it is also advantageous if pressing, stamping, shaping on, painting on, brushing out, screen printing, lithography, flexography, offset printing or inkjet printing are used as printing technologies.

It is also advantageous if the liquid is removed by chemical, thermal or electrical methods.

And it is also advantageous if the detachment of the printed functional element from the substrate and/or the installation in a resistance sensor and/or the application of contact elements are realized as further processing steps.

In the case of the printed magnetic functional element for resistance sensors according to the invention, the functional element is composed of several components of a film, which are arranged in such a quantity and in such a manner that the electrical conductivity of the contacts is realized via the components and/or other electrically conducting materials of the functional element and furthermore at least 5% of the components of the functional element have a magnetoimpedance effect.

Advantageously, the at least 5% of the constituents of the functional element have a GMR effect and/or an AMR effect.

By means of the present invention it is possible for the first time to produce printed magnetic functional elements for resistance sensors in a simple and cost-effective manner, to integrate this production method in a reproducible manner and with methods known per se easily into existing production processes and to obtain a functional element with properties that can be adjusted in the desired manner.

This is realized in that a magnetic material that has a magnetoimpedance effect or is of magnetic materials which in their combination have a magnetoimpedance effect, is deposited on a substrate as a film by means of thin film technologies. The film is of large area and small thickness.

Within the scope of this invention, it is to be understood as a film of a magnetic material that the magnetic material is deposited on a substrate in the form of particles with any shape and size as an individual layer or as a multilayered stack. The proportion of magnetic material in the film should thereby be at least 5% by weight.

Coated or uncoated materials, paper or paper-like materials, wood or wood-like materials, inorganic materials such as glass, silicon wafers, metals, alloys, ceramic, organic materials such as polymers, plastics, rubber, textiles or crystalline, polycrystalline or amorphous materials can be used as substrates. The substrates can also be reused after the layers are released/removed, since the delamination does not impair the substrate.

For example, magnetron sputtering, electron beam coating, chemical vapor deposition (CVD) or molecular beam coating can be applied as the thin film technologies used.

The film is removed from the substrate and during the removal or subsequently, the film is divided into several components.

This can be realized, for example, by tearing, breaking, cutting, milling. Components are produced, for example, in the form of powders, granulates, flakes, needles, tubes, spheres, hollow spheres or wires, in regular or irregular shapes and different sizes.

Within the scope of this invention, the term components is to be understood to mean the fragments of the film, but not, for instance, their constituents in the chemical sense. These fragments can be regular or irregular depending on the method for removal from the substrate.

Even in the case of a thin layer stack as a film, the components do not all need to have originally applied thin layers, but at least 5% of all components printed for a functional element must have a magnetoimpedance effect, advantageously a GMR effect and/or an AMR effect.

The components obtained are then processed with a liquid to form a dispersion or a paste or a gel and subsequently applied to a substrate by means of printing technologies.

In the printing of the functional element it must be ensured that such a quantity of components and/or other electrically conducting materials is available that at least the electrical conductivity of the contacts is realized via the functional element.

For example, water, organic or inorganic solvents can be used as a liquid.

Likewise, all materials that already can be used for thin film technology can be used as a substrate.

The printing technologies within the scope of the present invention should be understood to mean methods with which the materials can be printed, pressed, stamped, shaped, as well as painting, screen printing, lithography, flexography, offset printing or inkjet printing.

Subsequently, the liquid is removed and further processing steps follow. The removal of the liquid can be carried out by chemical, thermal or electrical methods, for example, by increasing the temperature.

For example, the detachment of the printed functional element from the substrate and/or the installation into a resistance sensor and/or the attachment of contact elements can be realized as further processing steps.

Due to the simplicity of the production, printed and ductile magnetic functional elements can be produced on just about any type of surface or also free-standing.

The functional elements used have the magnetoimpedance effect but additionally can also have an isotropic or anisotropic characteristic. The functional element with isotropic characteristic contains randomly oriented parts. To achieve anisotropic characteristic, the parts have to be aligned mechanically or by the application of an external electromagnetic field.

The number of electrical or thermal connections/contacts and the types of conductive materials are not limited, like the contacts, which can be present in any form and arrangement.

Electrical and/or thermal contacts that are used for the magnetic functional element of the magnetoresistance sensor can be applied and/or attached at any point on its surface and/or inside its volume.

These contacts can be applied and/or attached before or after the production of the functional element by means of known technologies and from known materials.

The functional element can be applied to flexible and elastic substrates; it can be free standing, with or without protective layers.

Magnetic materials can have a plurality of magnetoresistance effects, including the anisotropic magnetoresistance (AMR) effect, the giant magnetoresistance effect (GMR) and the giant magnetothermal resistance effect, wherein these effects depend on the type, the number and the structure of the film and in particular the layers in multilayer systems, the thickness of the film, the materials applied and the coating conditions.

The major difference of the present invention compared to the prior art lies in particular for the GMR effect as magnetoimpedance effect in that according to the prior art the respective functional element is composed of a matrix with magnetic particles, which have a magnetoimpedance effect only in this totality, whereas according to the present invention individual components of the printed functional element respectively have a magnetoimpedance effect individually. This can be the same or also a different magnetoimpedance effect. Likewise, all of the components in the printed functional element do not need to have a magnetoimpedance effect. It must only be ensured that the components and/or other electrically conducting materials are present in the printed functional element in such a quantity and are arranged such that they realize an electric conductivity of the contacts via the functional element. The properties of the functional element can be adjusted in a targeted manner via the number and size of the components in the printed functional element that have a magnetoimpedance effect.

Components of different films of different magnetic materials can thereby also be used for the functional element according to the invention.

The main advantage of the present invention lies in the possibility of precise control of the properties of the magnetic functional element on a plurality of substrates with subsequent separation or delamination from the substrates or without substrates.

The control of the properties of the printed magnetic functional element can be exerted via the type of magnetic materials, via their concentration in the dispersion and via the size and shape of the components in the dispersion, the paste or the gel.

During the delamination, the adhesive forces between the atoms or molecules in the selected substance are reduced in the separation layer. Mechanical, chemical, thermal or electrical delamination technologies can be used in the present invention. The adhesion on the surface must be reduced so that the films can be removed.

Acoustic surface waves can also be applied in order to change adhesive forces, or washing out by brushing or shock cooling or other methods.

The delaminated films and/or components can have dimensions of a few nanometers up to a few millimeters and have a plurality of shapes. The delaminated films and/or components can also be pulverized, for example, by grinding methods in order, for example, to obtain components of the same size. Through such additional methods the delaminated films and/or components can be provided with additional properties, in order, for example, to improve the homogeneity of inks or pastes. However, these additional methods must not have any effect on the electrical and magnetic properties of the magnetic materials.

After the magnetic functional element according to the invention has been produced, it is integrated into a magnetoresistance sensor or the magnetic functional element according to the invention can also operate alone as a magnetoresistance sensor. To this end, direct current or alternating current or a heat flux is applied to the sensor. This changes the complex magnetoimpedance, which in turn leads to a change in the electric or thermal potential via the sensor or to a change in its power dissipation.

The invention is described in more detail below based on an exemplary embodiment.

They show

Figure 1:
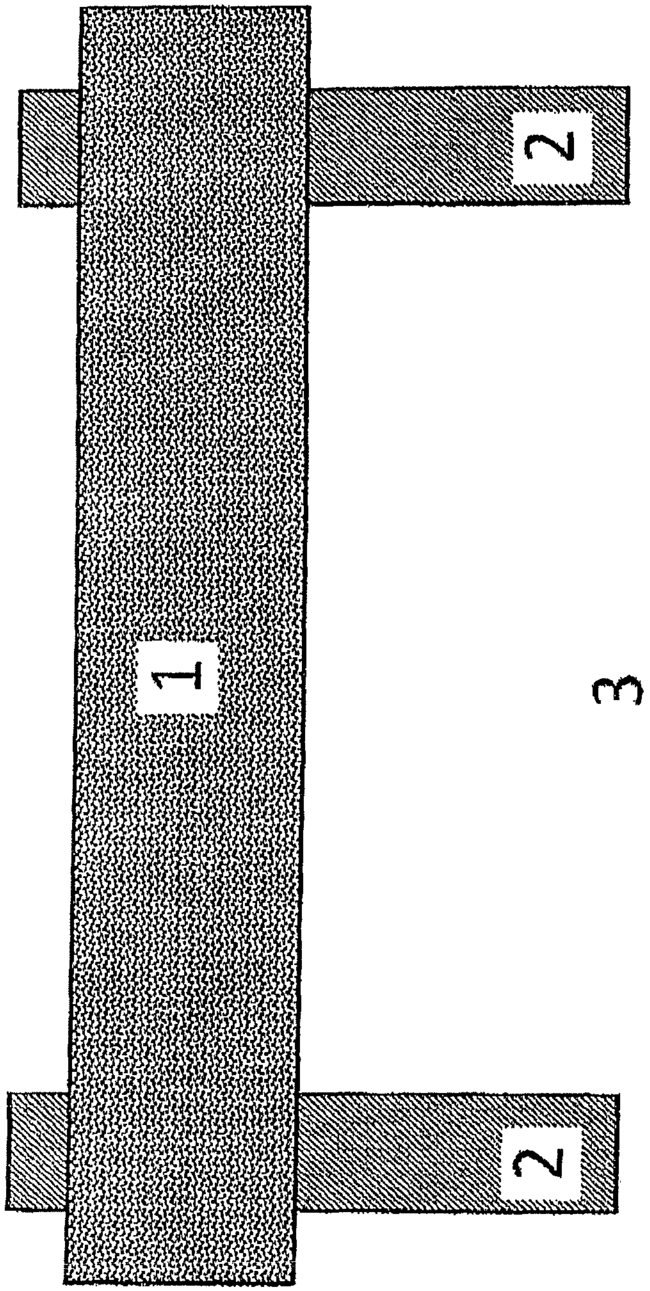
FIG. 1 shows the diagrammatic structure of the functional element according to the invention in plan view (reference numerals 1, 2 and 3)
Figure 2:
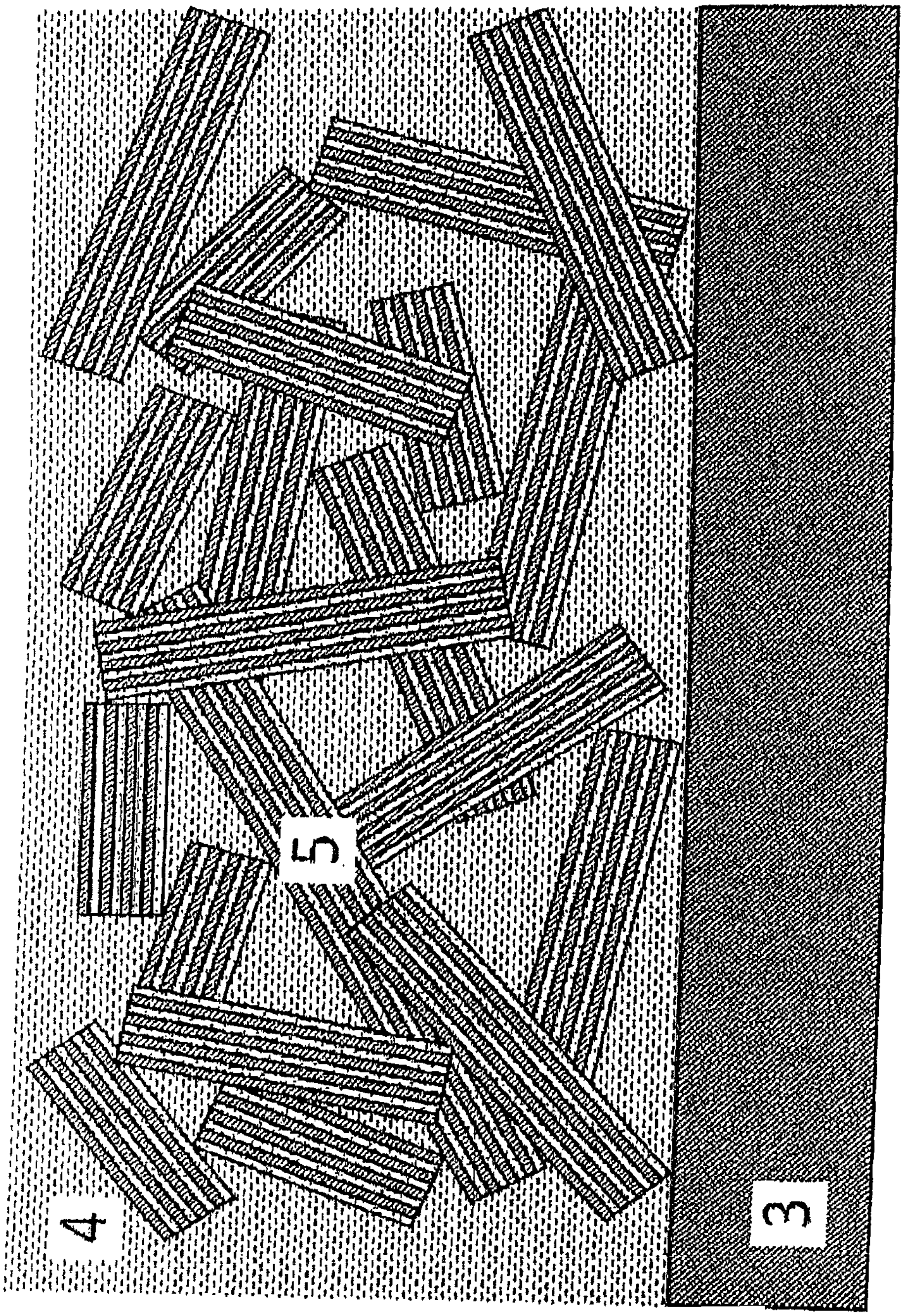
FIG. 2 shows a cross section through the functional element according to the invention with isotropic arrangement of components (reference numerals 3, 4 and 5)
Figure 3:
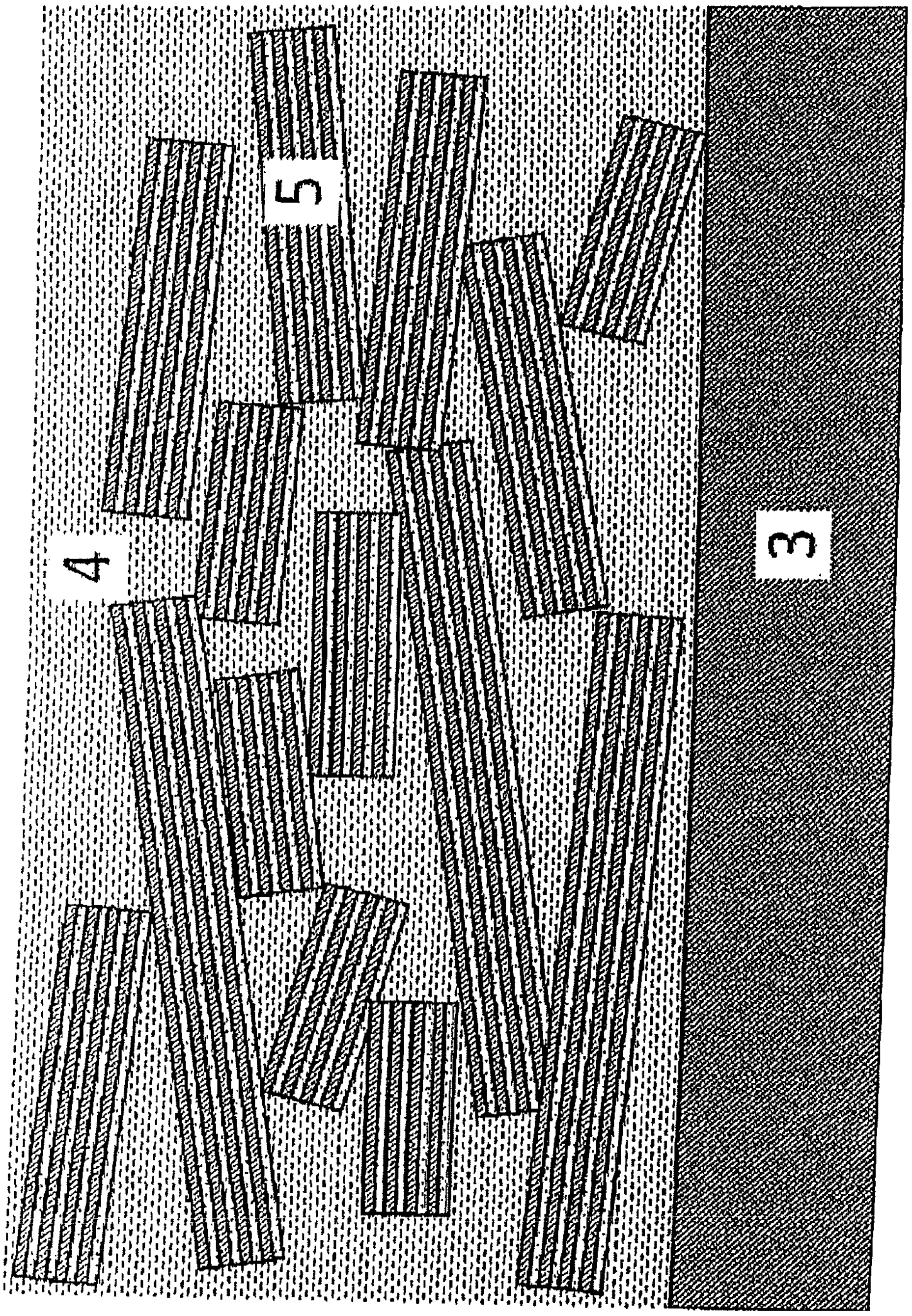
Figure 4:
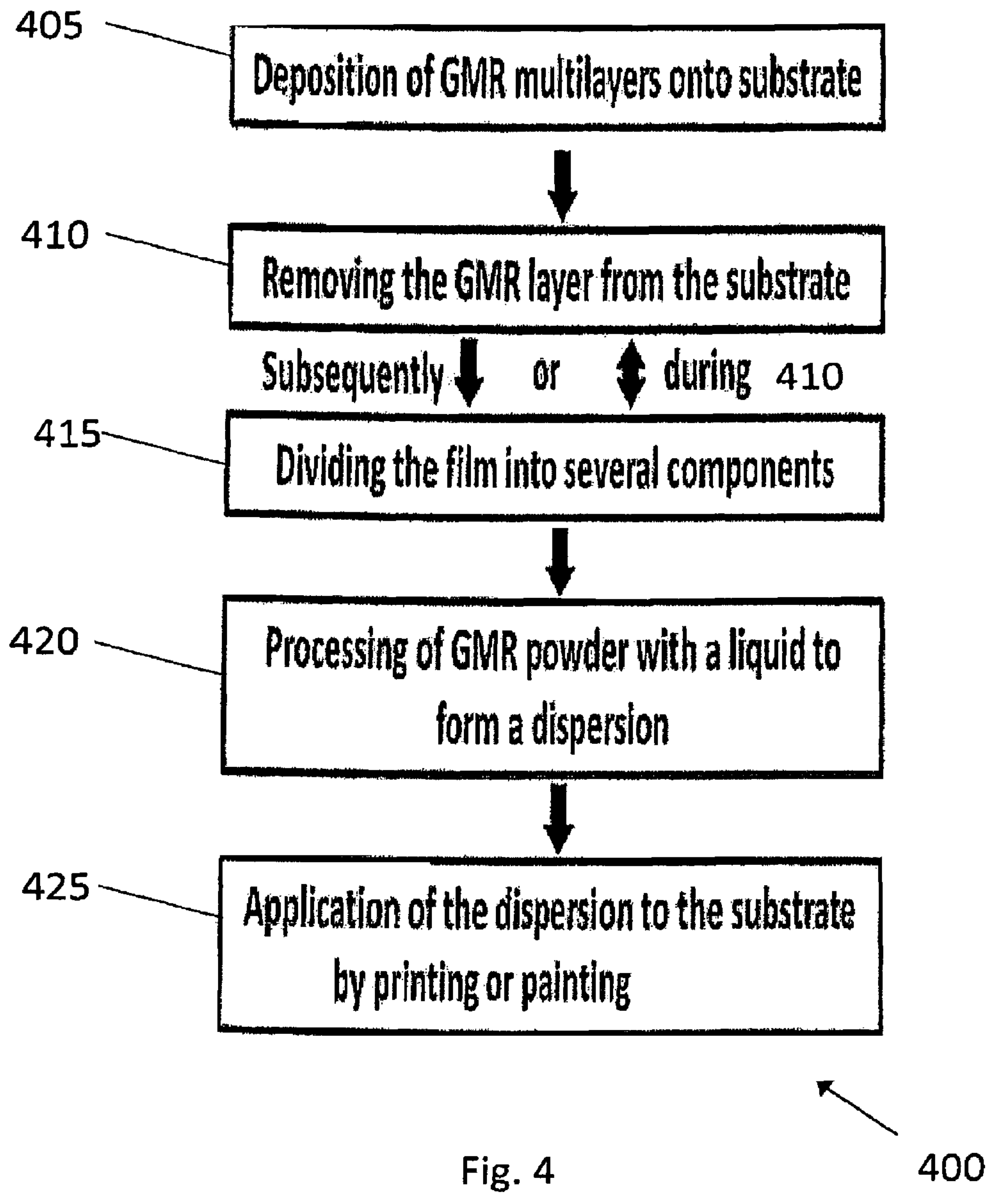

FIG. 3 shows a cross section through the functional element according to the invention with anisotropic arrangement of components (reference numerals 3, 4 and 5); and FIG. 4 shows an exemplary flow diagram 400 for performing aspects of embodiments of the invention. At 405, GMR multilayers are deposited onto a substrate. At 410, the GMR layer is removed from the substrate. At 415, subsequent to 410 (or during 410), the film is divided into several components (e.g. to form GMR powder). At 420, GMR powder is processed with a liquid to form a dispersion. At 425, the dispersion is applied to the substrate by printing or painting.

EXAMPLE

A multilayered stack with a diameter of 75 mm of alternately Co layers and Cu layers with a total thickness of 110 nm and a layer thickness of Co and Cu of respectively 1.0 and 1.2 nm, which have the magnetic GMR effect, is applied on a Si (100) wafer with a thickness of 0.5 mm at room temperature by means of DC magnetron sputtering. The multilayered stack is detached from the substrate by means of lift-off technology. The multilayered stack is broken into irregularly shaped components, wherein their dimensions are in the micrometer to millimeter range. These components are distributed homogenously in a conductive binder. This binder is brushed onto a substrate of kapton using a blade. Cu wires with a diameter of 0.3 mm are applied as contacts. The substrate has dimensions of 20×20 mm length and width and the binder with the components covers 10% of the surface of the substrate with a thickness on average of 100 μm. After the drying of the coated substrate at 20° C. in air, the functional element according to the invention can be used as a resistance sensor.

The invention claimed is:

1. A method for producing a magnetic functional element for resistance sensors, comprising:

depositing at least 5% by weight of a magnetic material that has a giant magnetoresistance (GMR) effect, or of magnetic materials which in their combination have a GMR effect, as a film on a substrate by thin film technologies;

removing the film from the substrate;

dividing the film during the removing, or subsequent to the removing, into several components;

processing the components with a liquid to form one of a dispersion, a paste, and a gel;

applying the one of the dispersion, the paste, and the gel to a further substrate by printing technologies;

removing the liquid; and performing further processing comprising one of:

applying the components of the film as a functional element in such quantity to attain a conductivity of the functional element, and applying the components of the film and other electrically conducting materials as a functional element in such quantity to attain a conductivity of the functional element.

2. The method according to claim 1, in which Co/Cu, Py/Cu, Fe/Cr or Co/Au are used as a magnetic material.

3. The method according to claim 1, in which magnetron sputtering, electron beam coating or molecular beam coating are used as thin film technologies.

4. The method according to claim 1, in which coated or uncoated materials, paper or paper-like materials, wood or wood-like materials, inorganic materials such as glass, silicon wafers, metals, alloys, ceramic, organic materials, such as polymers, plastics, rubber, textiles or crystalline, polycrystalline or amorphous materials are used as substrates both for the thin film technologies as well as for the printing technologies.

5. The method according to claim 1, in which the removal of the film from the substrate is realized in a physical, chemical, thermal or electrical manner.

6. The method according to claim 5, in which the removal of the film is attained with the use of acoustic surface waves.

7. The method according to claim 1, in which the separation of the film into components is carried out by tearing, breaking, cutting, milling.

8. The method according to claim 1, in which polymers in water, organic or inorganic solvents are considered as a liquid.

9. The method according to claim 1, in which pressing, stamping, shaping on, painting on, brushing out, screen printing, lithography, flexography, offset printing or inkjet printing are used as printing technologies.

10. The method according to claim 1, in which the liquid is removed by chemical, thermal or electrical methods.

11. The method according to claim 1, in which the detachment of the printed functional element from the substrate and/or the installation in a resistance sensor and/or the application of contact elements are attained as further processing steps.

* * * * *